United States Patent
Nagashima

(10) Patent No.: US 8,841,965 B2
(45) Date of Patent: Sep. 23, 2014

(54) AMPLIFIER

(75) Inventor: Yoshikazu Nagashima, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 22 days.

(21) Appl. No.: 13/607,509

(22) Filed: Sep. 7, 2012

(65) Prior Publication Data

US 2013/0187715 A1 Jul. 25, 2013

(30) Foreign Application Priority Data

Jan. 25, 2012 (JP) ................ P2012-012967

(51) Int. Cl.
*H03F 3/38* (2006.01)

(52) U.S. Cl.
USPC .......................................... 330/10

(58) Field of Classification Search
USPC ............. 330/10, 207 A, 251; 375/238, 297
See application file for complete search history.

(56) References Cited

U.S. PATENT DOCUMENTS

| | | | |
|---|---|---|---|
| 7,265,617 B2 | 9/2007 | Ohkuri | |
| 7,548,110 B2 * | 6/2009 | Lin | 330/10 |
| 7,795,970 B2 * | 9/2010 | Kaya et al. | 330/251 |
| 7,855,597 B2 * | 12/2010 | Chen et al. | 330/10 |
| 2011/0133836 A1 * | 6/2011 | Yu et al. | 330/251 |
| 2013/0033319 A1 * | 2/2013 | Chen et al. | 330/251 |

FOREIGN PATENT DOCUMENTS

| | | |
|---|---|---|
| JP | 09-009645 | 1/1997 |
| JP | 2004-289813 | 10/2004 |

* cited by examiner

*Primary Examiner* — Khanh V Nguyen
(74) *Attorney, Agent, or Firm* — Patterson & Sheridan, LLP

(57) ABSTRACT

An amplifier includes a PWM converter that carries out pulse width modulation on differential input signals to generate differential PWM signals by comparing the differential input signals with sawtooth or triangular reference signal, and a power amplifier that carries out power amplification of the differential PWM signals to generate differential output signals. The power amplifier has a driver that drives a load with differential driving signals, a controller that sets a dead time in the differential driving signals to prevent current flow between power supply and ground terminals of the driver circuit, and a pre-delay compensator that generates the differential driving signals based on the differential PWM signals and sends the differential driving signals to the controller. The differential driving signals generated by the pre-delay compensator includes a pulse width for compensating for the dead time that is to be set in the differential driving signals by the controller.

20 Claims, 8 Drawing Sheets

AMPLIFIER

CROSS-REFERENCE TO RELATED APPLICATION

This application is based upon and claims the benefit of priority from Japanese Patent Application No. 2012-012967, filed Jan. 25, 2012; the entire contents of which are incorporated herein by reference.

FIELD

Embodiments described herein relate to an amplifier.

BACKGROUND

In cell phones, digital audio players, etc., a class D amplifier that has high power efficiency and that can be miniaturized is used in more and more devices. In a class D amplifier, differential input signals are compared with a sawtooth or triangular reference signal to generate differential PWM signals and, on the basis of the differential PWM signals, a driver circuit is driven. One drawback of the class D amplifier is that electric power is consumed each time the signal logic of the differential PWM signals is changed.

Consequently, a class BD amplifier, in which the driver circuit is driven on the basis of the phase difference signal of the differential PWM signals, is receiving more attention. In the class BD amplifier, the pulse signal is generated and electric power is consumed only when there is a phase difference between the differential PWM signals. As a result, it is possible to decrease the power consumption in the class BD amplifier relative to the class D amplifier.

In the class D amplifier and the class BD amplifier, the output section of the driver circuit includes a PMOS transistor and an NMOS transistor connected in tandem between the power supply terminal and the ground terminal. If the PMOS transistor and the NMOS transistor are turned on at the same time, a current flows between the power supply terminal and the ground terminal, so that power consumption is undesirably increased.

As a result, a dead time is forcibly set in the differential PWM signals input to the gate of the PMOS and NMOS transistors connected in tandem between the power supply terminal and the ground terminal. When these transistors are switched on/off, they are turned on/off together.

However, for the class BD amplifier, there is the following characteristic feature: on the basis of the phase difference signal between the differential PWM signals, the driver circuit is driven, so that the pulse width of the phase difference signal is intrinsically narrow. Consequently, as the dead time is set, the pulse width of the phase difference signal disappears entirely, so that a normal amplification operation cannot be carried out.

DETAILED DESCRIPTION

In general, embodiments will be explained with reference to figures.

According to one embodiment, there is provided an amplifier that can carry out a normal amplification operation even when a dead time is set. The amplifier includes a preamplifier that amplifies differential input signals and generates the differential output signals, a PWM converter that carries out pulse width modulation of the differential output signals to generate differential PWM signals based on a result of a comparison of the differential output signals with a sawtooth or triangular reference signal, and a power amplifier that carries out power amplification of the differential PWM signals to generate the final differential output signals. The power amplifier includes a driver circuit that drives a load on the basis of the differential driving signals in synchronization with the differential PWM signals, an output-section controller that has a dead time set between the differential driving signals so that no current flows between the power supply terminal and the ground terminal in the driver circuit, and a pre-delay compensator that generates the differential driving signals added with a pulse width for compensating the dead time on the basis of the differential PWM signals and sends the differential driving signals to the output-section controller.

Embodiment 1

Figure 1:
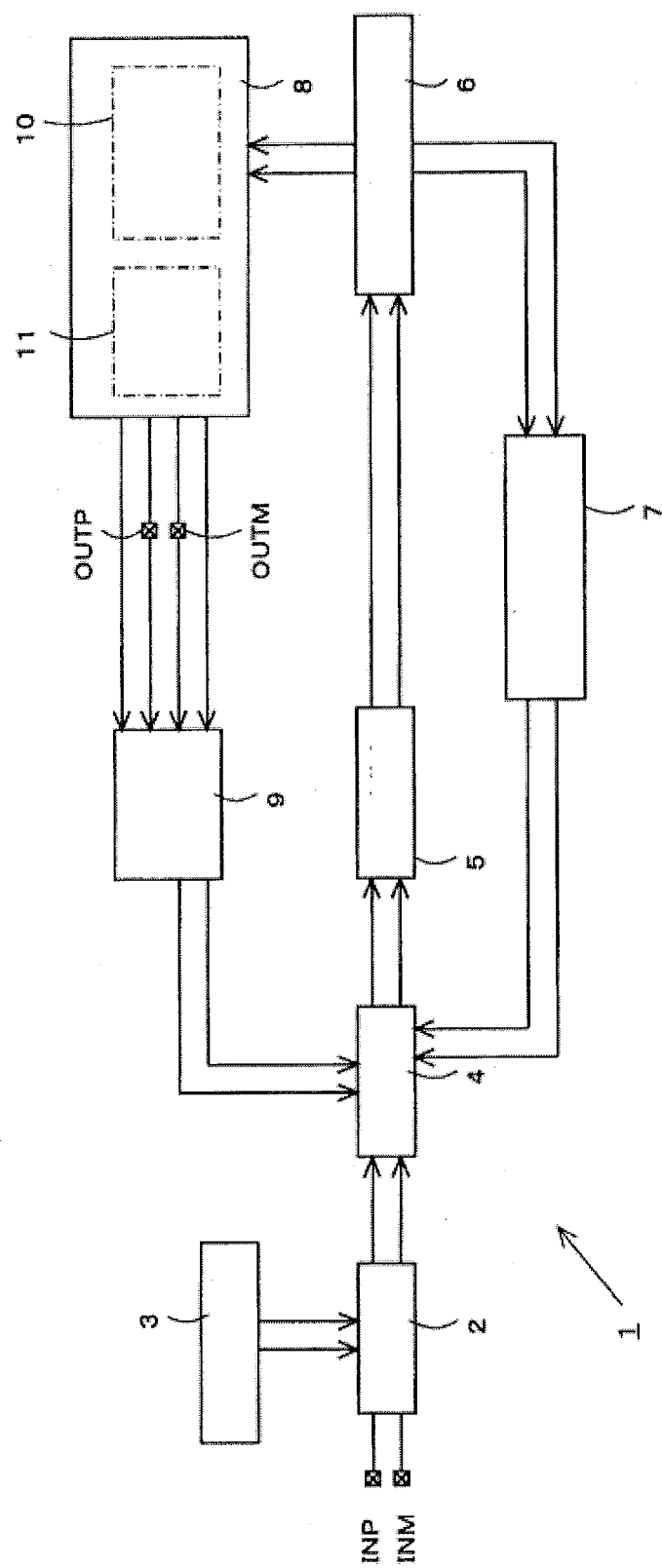
FIG. 1 is a schematic block diagram illustrating an amplifier according to a first embodiment.

FIG. 1 is a block diagram illustrating schematically an amplifier 1 according to Embodiment 1. The amplifier shown in FIG. 1 is the so-called class BD amplifier that converts differential input signals input into the differential input terminals INP, INM to PWM signals, and amplifies phase difference signals of the PWM signals to generate the final differential output signals.

Figure 2:
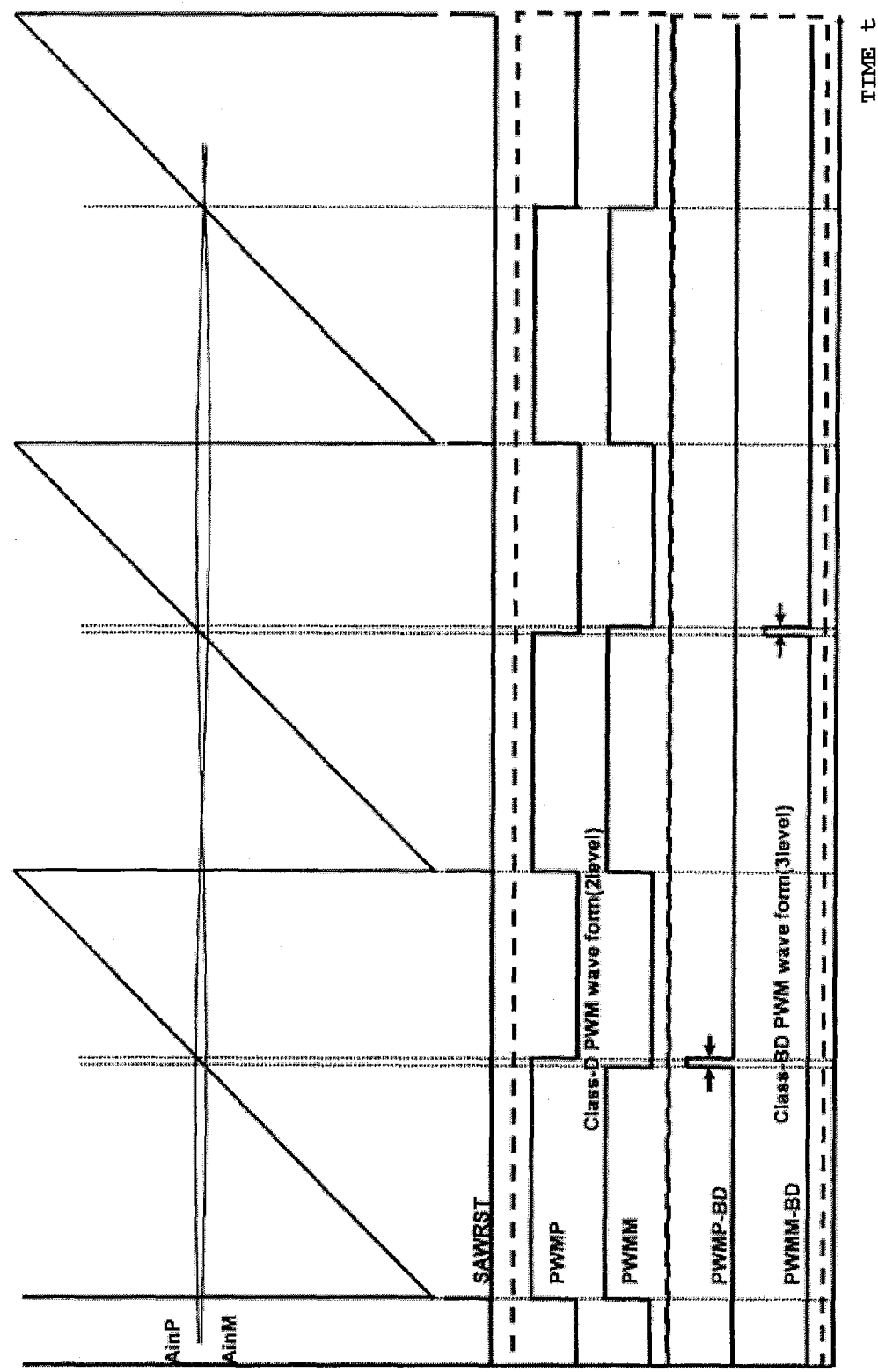
FIG. 2 is a diagram illustrating the basic operation of the class BD amplifier.

FIG. 2 is a diagram illustrating the basic operation of the class BD amplifier. The amplifier 1 shown in FIG. 1 compares the differential output signals AinP, AinM obtained using the preamplifier 4, by amplifying the differential input signals input into the differential input terminals INP, INM of an input switching unit 2 with a sawtooth reference signal, and generates differential PWM signals (PWMP signal and PWMM signal) using a PWM converter 5. With a power amplifier 8, the driver circuit is then driven on the basis of the phase difference signals PWMP-BD, PWMM-BD of the PWMP signal and the PWMM signal to generate the final differential output signals OUTP, OUTM.

The amplifier 1 according to the present embodiment carries out a class BD amplification operation and has the following characteristic features: it has a dead-time compensating circuit to prevent the pulse width of the differential phase difference signals from disappearing or becoming too narrow, which is caused by dead time when the dead time is set to prevent a current from flowing in the driver circuit that generates the final differential output signals OUTP, OUTM. Also, in the amplifier 1 according to the present embodiment, it is possible to carry out correction of the DC offset generated at the various portions in the amplifier 1 and duty correction of the PWM signals (together hereinafter to be referred to as calibration). When calibration is carried out, the differential input signals input into the differential input terminals INP, INM are forcibly converted to a signal-free state. Also, the DC offset correction quantity and duty correction quantity obtained by calibration are adopted as they are, even during normal operation after the end of the calibration. Here, normal operation refers to the class BD amplification operation of the differential input signals carried out by the amplifier 1.

In the following, the amplifier 1 according to the present embodiment will be explained in detail with reference to FIG. 1. The amplifier 1 shown in FIG. 1 has an input switching unit 2, a reference voltage generator 3, a preamplifier 4, a PWM converter 5, a calibration unit 6, a calibration D/A converter 7, a power amplifier 8, and a feedback amplifier 9.

The input switching unit 2 sets the differential input signals to the same voltage level as the reference voltage signals when calibration is carried out. The preamplifier 4 amplifies the differential input signals to generate the differential output signals. The PWM converter 5 compares the differential output signals with a sawtooth or triangular reference signal and, based on the result of such a comparison, performs pulse width modulation of the differential output signals to generate differential PWM signals.

When the calibration is carried out, the calibration unit 6 generates a digital offset adjusting signal and a digital duty adjusting signal of the PWM signals corresponding to the phase difference between the differential PWM signals. When the calibration is carried out, the calibration D/A converter 7 generates an analog offset adjusting signal by analog conversion of the digital offset adjusting signal, and an analog duty adjusting signal by analog conversion of the digital duty adjusting signal. When the calibration is carried out, the preamplifier 4 adjusts the voltage level of the differential output signals on the basis of the analog offset adjusting signal so that the voltage difference between the differential output signals output from the preamplifier 4 becomes smaller. It is possible to carry out calibration of the DC offset and the duty.

The calibration unit 6 of the present embodiment outputs the differential PWM signals generated by the PWM converter 5 to the power amplifier 8. The power amplifier 8 carries out power amplification of the differential PWM signals output from the calibration unit 6, and generates the final differential output signals OUTP, OUTM.

The power amplifier 8 has a dead-time compensating circuit 10 and a driver circuit 11. The dead-time compensating circuit 10 generates the phase difference signals of the differential PWM signals generated by the PWM converter 5, sets the dead time in the phase difference signals and, at the same time, adds the pulse width for dead time compensation.

Figure 3:
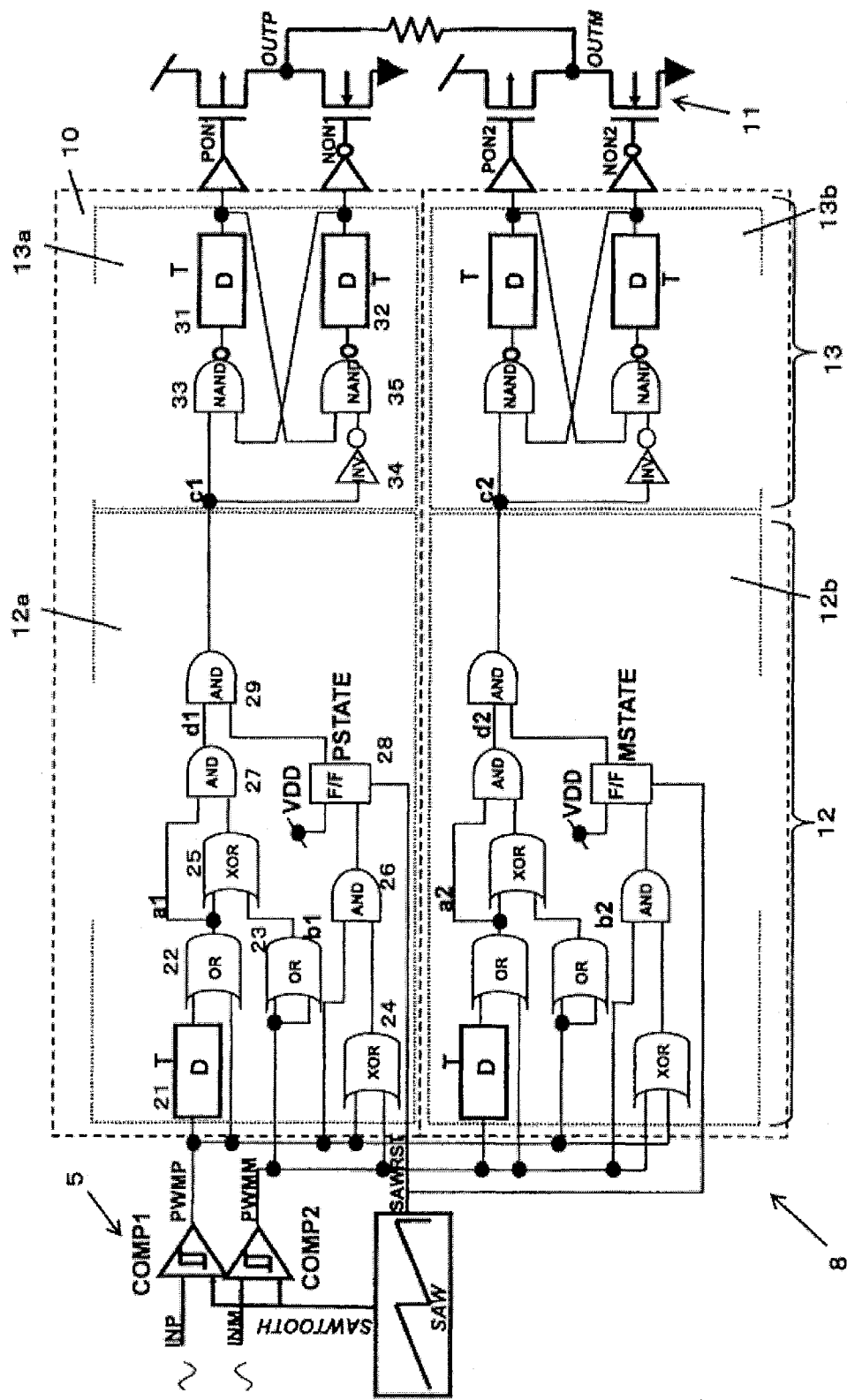
FIG. 3 is a circuit diagram illustrating an example configuration of a power amplifier in the amplifier of the first embodiment.

FIG. 3 is a circuit diagram illustrating an example configuration of the power amplifier 8. As shown in the figure, the dead-time compensating circuit 10 in the power amplifier 8 has a pre-delay compensator 12 and an output-section controller 13.

The pre-delay compensator 12 generates the differential signals to which the pulse width for dead time compensation on the basis of the differential PWM signals has been added, and then sends them to the output-section controller 13. The output-section controller 13 generates the differential driving signals for driving the driver circuit 11 on the basis of the differential signals generated by the pre-delay compensator 12, and sets the dead time in the differential driving signals so that no current flows between the power supply terminal and the ground terminal in the driver circuit 11.

As shown in FIG. 3, the pre-delay compensator 12 and the output-section controller 13 each are divided into two portions. When one of the differential PWM signals (PWMP signal) has a pulse width larger than that of the other (PWMM signal), the circuit in the upper half of FIG. 3 sets the output terminal OUTP of the driver circuit 11 to a high level. When the PWMM signal has a pulse width larger than the PWMP signal, the circuit in the lower half of FIG. 3 sets the output terminal OUTM of the driver circuit 11 to a high level.

In the following description, the upper half of the pre-delay compensator 12 is referred to as the first pre-delay compensator 12a, and the lower half is referred to as the second pre-delay compensator 12b; the upper half of the output-section controller 13 is referred to as the first output-section controller 13a, and the lower half is referred to as the second output-section controller 13b.

The first pre-delay compensator 12a and the second pre-delay compensator 12b have the same circuit configuration, and the first output-section controller 13a and the second output-section controller 13b have the same circuit configuration. In the following description, a typical example of the configuration of the first pre-delay compensator 12a and the first output-section controller 13a will be explained.

The first pre-delay compensator 12a has the following parts: a pulse-width adding circuit 21 that generates an extended PWMP signal with the dead-time compensating pulse width added to the PWMP signal, a first OR circuit 22 that generates the logical OR signal of the extended PWMP signal and the PWMP signal, a second OR circuit 23 that generates the logical OR signal of the PWMM signals, a first XOR circuit 24 that generates the logical exclusive-OR signal of the PWMP signal and the PWMM signal, a second XOR circuit 25 that generates the logical exclusive-OR signal of the output signal of the first OR circuit 22 and the output signal of the second OR circuit 23, a first AND circuit 26 that generates the logical AND signal of the PWMP signal and the output signal of the first XOR circuit 24, a second AND circuit 27 that generates the logical AND signal of the output signal of the first OR circuit 22 and the output signal of the second XOR circuit 25, a F/F (flip/flop) 28 that carries out a latch operation at the output edge of the first AND circuit 26, and a third AND circuit 29 that generates the logical AND signal of the output signal of the second AND circuit 27 and the output signal of the F/F 28.

The first output-section controller 13a has the following parts: first and second dead-time generating units 31, 32, a first NAND circuit 33 that generates the logical NAND signal of the output signal of the second dead-time generating unit 32 and the output signal of the first pre-delay compensator 12a, an inverter 34 that generates an inverted signal of the output signal of the first pre-delay compensator 12a, and a second NAND circuit 35 that generates the logical NAND signal of the output signal of the first dead-time generating unit 31 and the output signal of the inverter 34.

The first and second dead-time generating units 31, 32 are each delay circuits, and the first NAND circuit 33 and the second NAND circuit 35 form the set-reset F/F. Because the first and second dead-time generating units 31, 32 made of delay circuits are connected to the output terminal of the set-reset F/F, the pulse width of the output signal of the set-reset F/F becomes narrower corresponding to the delay time of the delay circuit. This corresponds to the setting of the dead time.

Figure 4:
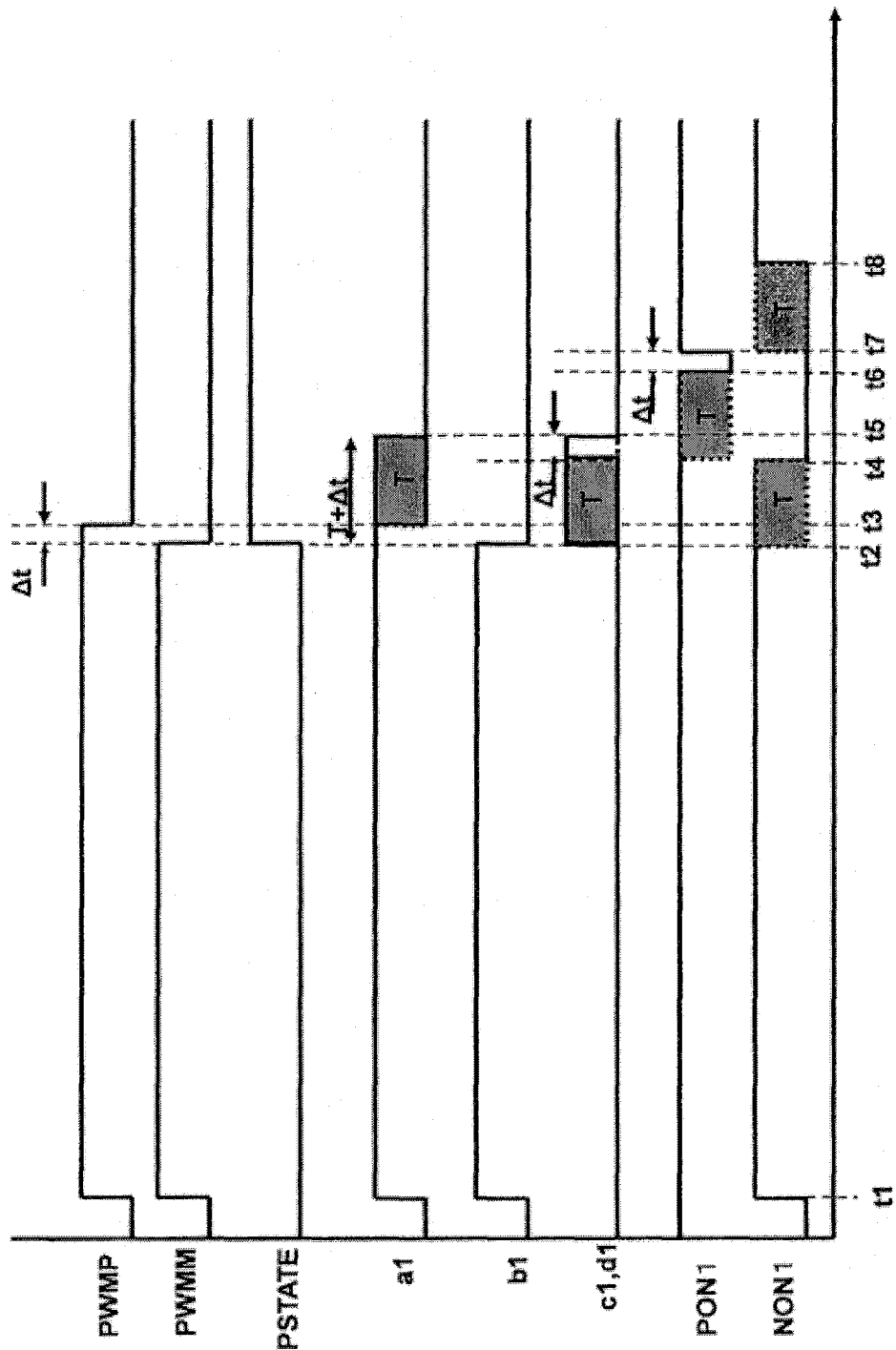
FIG. 4 is a diagram illustrating the operation timing of a first pre-delay compensator and a first output-section controller in the amplifier of the first embodiment.

FIG. 4 is an operation timing diagram illustrating the first pre-delay compensator 12a and the first output-section controller 13a. In the example shown in FIG. 4, an example wherein the pulse width of the PWMP signal is larger than the pulse width of the PWMM signal is presented. In this case, the PWMM signal is on the high level during the period from time point t1 to t2, and the PWMP signal is on the high level in the period from time point t1 to t3. In the period from time point t3 to t4 when the PWMP signal falls to the low level, the first pre-delay compensator 12a extends the pulse width of the PWMP signal. Consequently, the output signal a1 of the first OR circuit 22 is kept on the high level during the period from time point t1 to t5. The output signal b1 of the second OR circuit 23 has the same waveform as that of the PWMM signal, and the output signal of the second XOR circuit 25 and the output signal d1 of the second AND circuit 27 are on the high level during the period from time point t2 to t5. The F/F 28 changes the output signal of the first AND circuit 26 to the high level at time point t2. Consequently, the output signal c1 of the third AND circuit 29 is on the high level during the period from time point t2 to t5.

In the first output-section controller 13a, the first and second dead-time generating units 31, 32 set the dead time T during the period from time point t4 to t6. As a result, the width of a signal PON1 for driving the driver circuit 11 becomes narrower. However, as the pulse width corresponding to the dead time T is added by the pulse-width adding circuit 21 in the first pre-delay compensator 12a, the pulse of the signal PON1 does not disappear, and, as shown in FIG. 4, the pulse width of Δt can be guaranteed.

On the other hand, for the signal NON1 for driving the driver circuit 11, by the setting operation of the second dead-time generating unit 32, the pulse width becomes narrower during the period from time point t2 to t4, and it is on the low level during the period from time point t4 to t8.

In the ideal case, the duration of the pulse width generated by the pulse-width adding circuit 21 in the first and second pre-delay compensators 12a, 12b and the duration of the dead time generated by the dead-time generating circuit in the first and second output-section controllers 13a, 13b are preferably equal to each other. However, it is not necessary to have them to be the same. However, when the duration of the pulse width generated by the pulse-width adding circuit 21 in the first and second pre-delay compensators 12a, 12b is shorter than the duration of the dead time generated by the dead-time generating circuit in the first and second output-section controllers 13a, 13b, in some cases, the pulses of the final differential output signals OUTP, OUTM may disappear. Consequently, the duration of the pulse width generated by the pulse-width adding circuit 21 in the first and second pre-delay compensators 12a, 12b may be longer than the duration of the dead time generated by the dead-time generating circuit in the first and second output-section controllers 13a, 13b.

Figure 5:
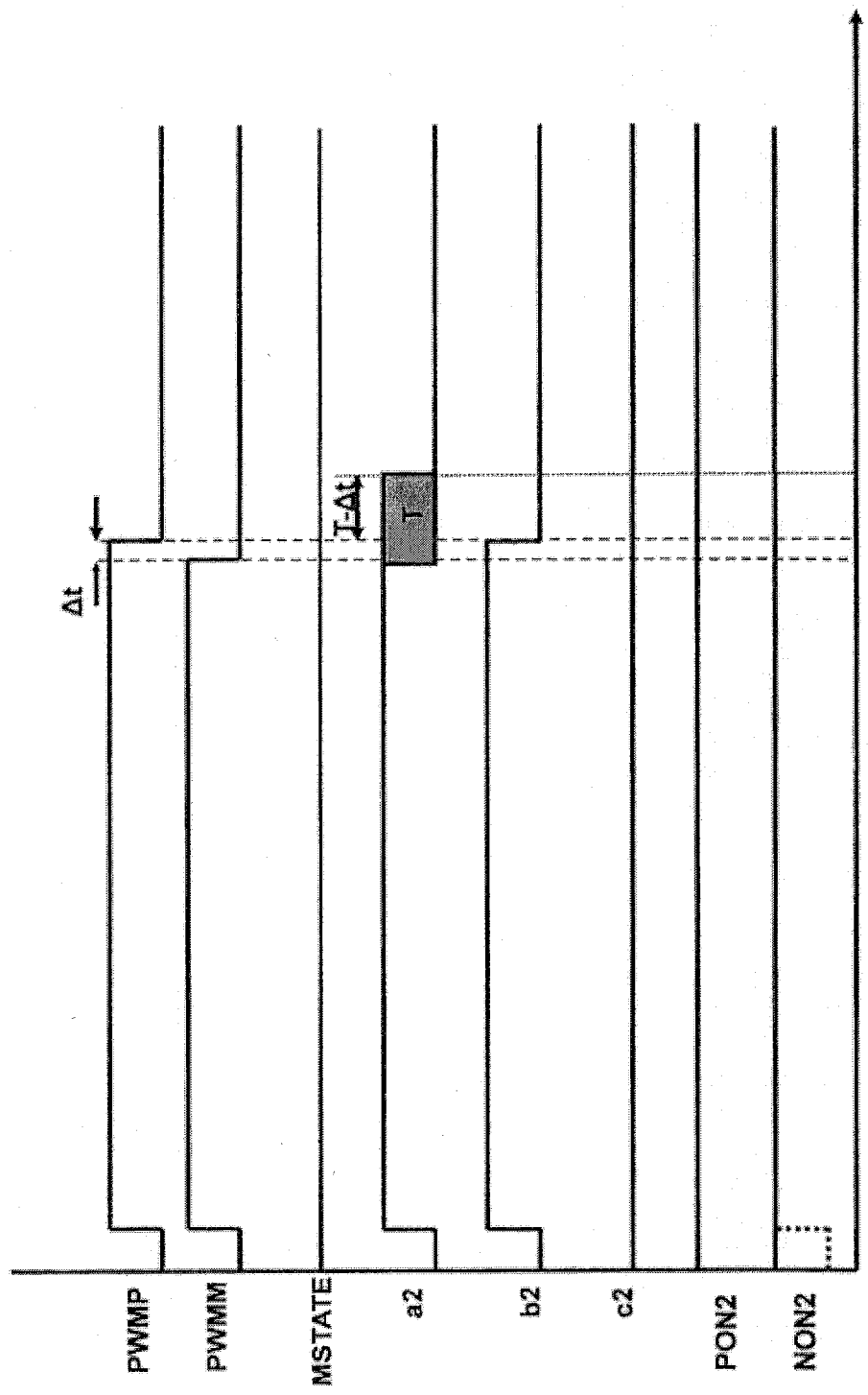
FIG. 5 is a diagram illustrating the operation timing of a second pre-delay compensator and a second output-section controller in the amplifier of the first embodiment.

FIG. 5 is an operation timing diagram illustrating the second pre-delay compensator 12b and the second output-section controller 13b. In the example shown in FIG. 5, the pulse width of the PWMP signal is longer than that of the PWMM signal. Also, in the second pre-delay compensator 12b, for the output signal a2 of the first OR circuit 22, the duration on the high level extends for a period of time corresponding to the pulse width T added by the pulse-width adding circuit 21, and the output signal of the F/F 28, MSTATE, is kept on the low level. Consequently, the logic states of output signals PON2 and NON2 of the second output-section controller 13b are kept constant. Consequently, the output terminal OUTM of the driver circuit 11 connected to the second output-section controller 13b is kept at a low level.

In this way, according to Embodiment 1, as the dead-time compensating circuit 10 is arranged in the power amplifier 8 and the pulse width of the PWM signal is extended by the pulse-width adding circuit 21, even when the pulse width for generating the dead time is narrow, the pulse width may disappear entirely.

More specifically, according to Embodiment 1, when the pulse width of the PWMP signal is longer than that of the PWMM signal, the pulse-width adding circuit 21 in the first pre-delay compensator 12a generates an extended PWMP signal added with the pulse width of the PWMP signal. As a result, for the first and second dead-time generating units 31, 32 in the first output-section controller 13a, even when the pulse width of the PON1 signal and the NON1 signal is narrower than the dead time duration, the pulse width of these signals still does not disappear. Consequently, even when the class BD amplification operation is carried out for amplifying the phase difference signal of the PWM signal, the load can still be driven with a high stability.

Embodiment 2

In Embodiment 1, the amplifier 1 that carries out the class BD amplification operation has been explained as one example. On the other hand, for the amplifier 1 according to Embodiment 2 to be presented below, as a characteristic feature, it is possible to switch between the class D amplification operation and the class BD amplification operation.

Figure 6:
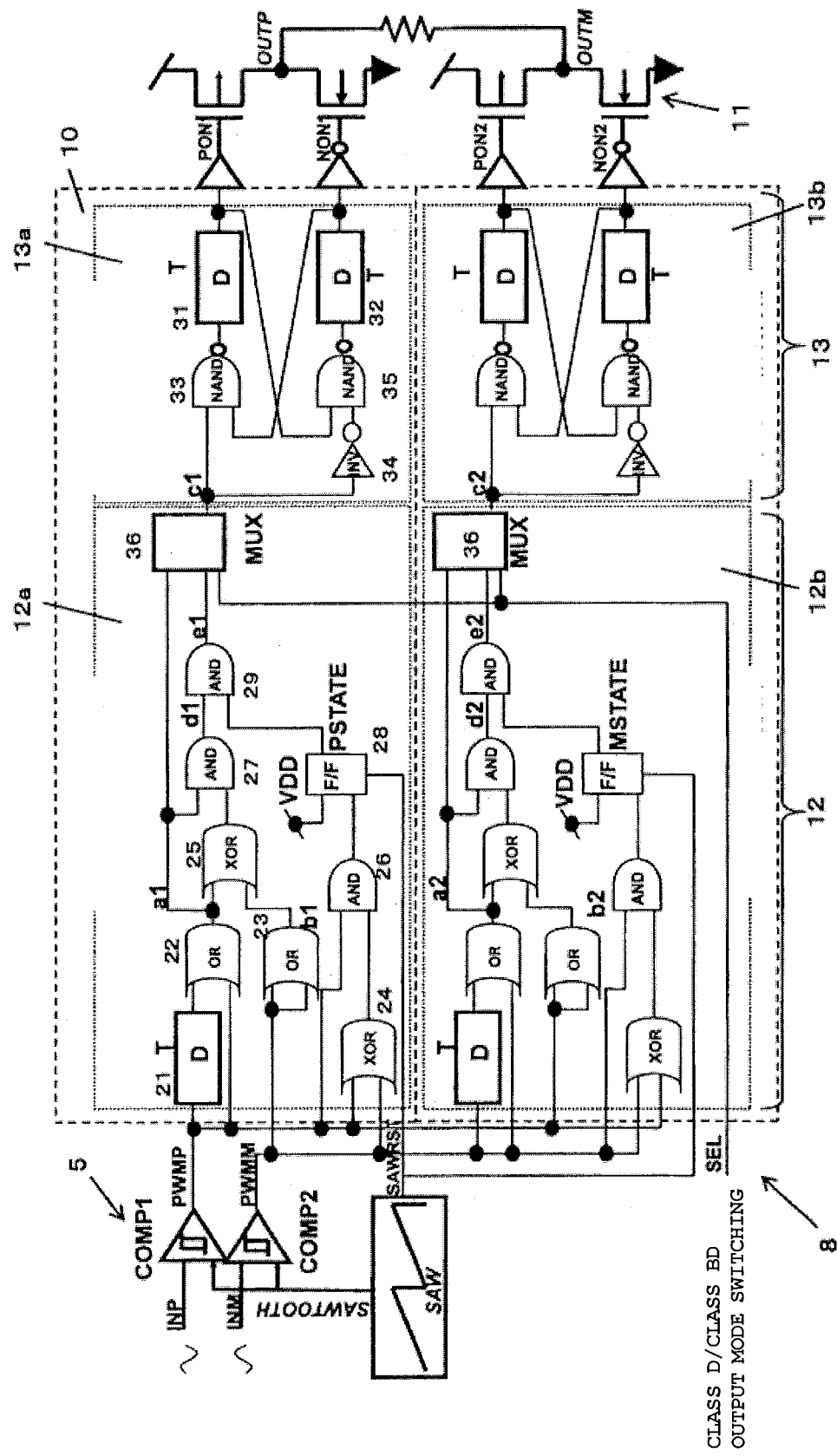
FIG. 6 is a circuit diagram illustrating the configuration of a power amplifier in an amplifier according to a second embodiment.

FIG. 6 is a circuit diagram illustrating the configuration of the power amplifier 8 according to Embodiment 2. The same symbols and reference numbers as in FIG. 3 are used in FIG. 6, and only the different features will be explained below.

The power amplifier 8 shown in FIG. 6 differs from the power amplifier 8 shown in FIG. 3 in that multiplexer (first selecting unit and second selecting unit) 36 is arranged in each of the first pre-delay compensator 12a and second pre-delay compensator 12b.

For the multiplexer 36, the output signal a1 of the first OR circuit 22 or the output signal e1 of the third AND circuit 29 is selected by the logic of the class D/class BD switching signal SEL. As can be seen from the operation timing diagram shown in FIG. 4, while the output signal a1 of the first OR circuit 22 is a signal obtained by extending the pulse width of the PWMP signal or PWMM signal, the output signal e1 of the third AND circuit 29 is an extended phase difference signal obtained by extending the pulse width of the phase difference signal of the PWMP signal and PWMM signal. Consequently, when the class D is selected by the switching signal SEL, the multiplexer 36 selects the output signal a1 of the first OR circuit 22, and when class BD is selected by the switching signal SEL, the output signal e1 of the third AND circuit 29 is selected.

The signals selected by the multiplexer 36 in the first pre-delay compensator 12a and the multiplexer 36 in the second pre-delay compensator 12b correspond to the differential driving signals.

When the multiplexer 36 selects the output signal a1 of the first OR circuit 22, the first output-section controller 13a and the second output-section controller 13b generate the signal obtained by deleting the pulse width for dead time compensation from the signal obtained by extending the pulse width of the PWMP signal or PWMM signal. In this case, the class D amplification operation is carried out. On the other hand, when the multiplexer 36 selects the output signal e1 of the third AND circuit 29, the first output-section controller 13a and the second output-section controller 13b generate a signal with the pulse width for dead time compensation deleted from it, from the signal obtained by extending the pulse width of the phase difference signals of the PWMP signal and PWMM signal. In this case, the class BD amplification operation is carried out.

In this way, as the multiplexer 36 for switching the signal selection by the class D/class BD switching signal SEL is arranged in the first pre-delay compensator 12a and second pre-delay compensator 12b, as needed, the class D amplification operation and the class BD amplification operation can be easily switched. Consequently, according to the present embodiment, the amplifier 1 can be used as both a class D amplifier and a class BD amplifier.

Embodiment 3

In Embodiment 3, the duration of the pulse width added by the pulse-width adding circuit 21 arranged inside the first pre-delay compensator 12a and second pre-delay compensator 12b, and the duration of the dead time generated by the first and second dead-time generating units 31, 32 arranged in the first output-section controller 13a and second output-section controller 13b are adjustable.

Figure 7:
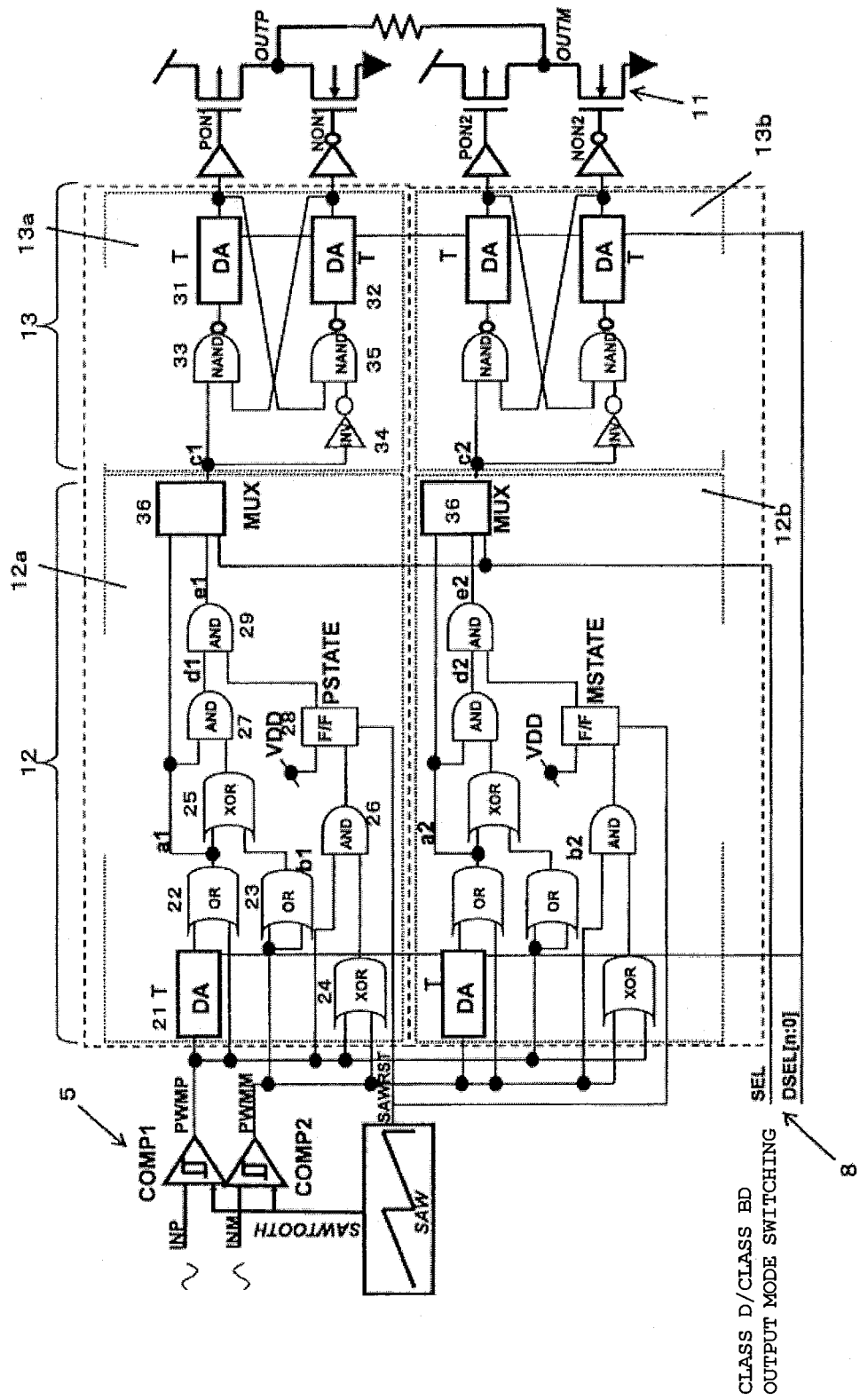
FIG. 7 is a circuit diagram illustrating the configuration of a power amplifier in an amplifier according to a third embodiment.

FIG. 7 is a circuit diagram illustrating the configuration of the power amplifier 8 according to Embodiment 3. The same keys as in FIG. 6 are used in FIG. 7, and only the different features will be explained below.

For the power amplifier 8 shown in FIG. 7, the duration of the pulse width added by the pulse-width adding circuit 21 arranged in the first pre-delay compensator 12a and second pre-delay compensator 12b can be adjusted, and the duration of the dead time generated by the first and second dead-time generating units 31, 32 arranged in the first output-section controller 13a and second output-section controller 13b can be adjusted.

The reason for adjusting the duration of the pulse width added by the pulse-width adding circuit 21 and the duration of the dead time generated by the first and second dead-time generating units 31, 32 is as follows: depending on the type of load connected to the amplifier 1 according to the present embodiment, the ON characteristics are different, and the optimum pulse width of the final differential output signals OUTP, OUTM also varies. Here, according to the present embodiment, corresponding to the type of load, the pulse width added by the pulse-width adding circuit 21 and the duration of the dead time generated by the first and second dead-time generating units 31, 32 can be adjusted.

Figure 8:
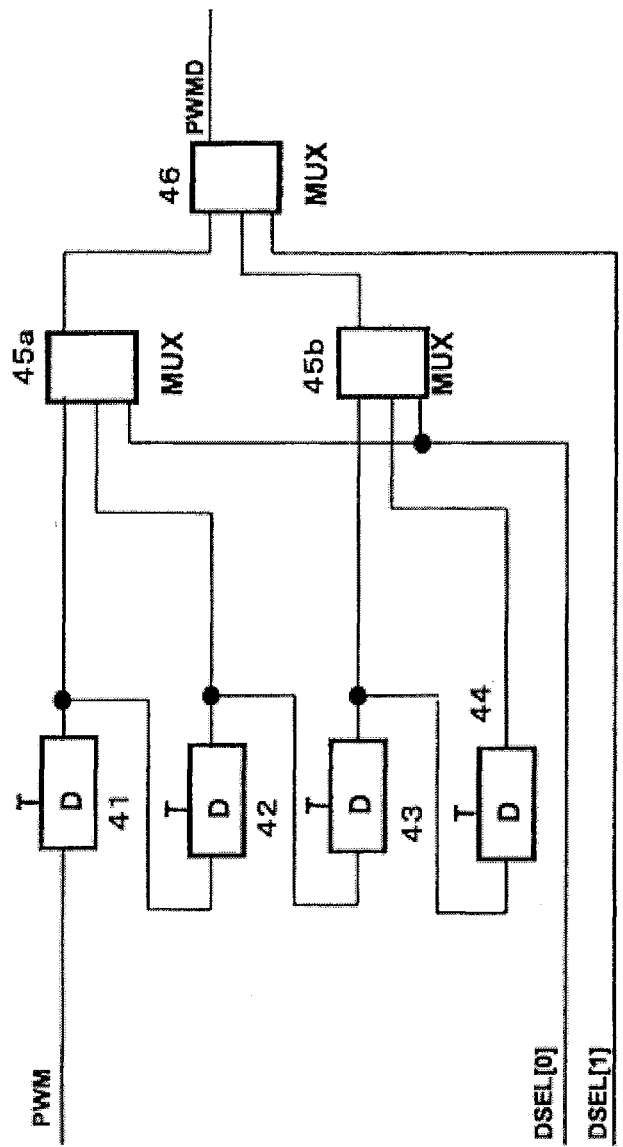
FIG. 8 is a block diagram illustrating an example configuration of a pulse-width adding circuit in the amplifier of the fourth embodiment.

FIG. 8 is a block diagram illustrating an example configuration of the pulse-width adding circuit 21. The pulse-width adding circuit 21 shown in FIG. 8 has the following parts: four pulse-width adding units 41 through 44 connected in tandem, former-section multiplexers 45a, 45b that select one of the outputs of the adjacent two pulse-width adding units, and latter-section multiplexer 46 that selects one of the outputs of the former-section multiplexers 45a, 45b. The latter-section multiplexer 46 selects one of the outputs of the four pulse-width adding units 41 through 44 connected in tandem. In the pulse-width adding circuit 21 shown in FIG. 8, it is possible to switch the 4 types of pulse width according to a selection signal DSEL [0:1], which can be set depending on the load connected to amplifier 1. Also, the first and second dead-time generating units 31, 32 may have the same circuit configuration as that shown in FIG. 8.

In this way, according to Embodiment 3, because the duration of the pulse width added by pulse-width adding circuit 21 and the duration of the dead time generated by the first and second dead-time generating units 31, 32 can be adjusted, it is possible to set the optimum duration for the pulse width and dead time corresponding to the type of load connected to the amplifier 1, so that various types of loads can be driven with a high stability.

Here, although it is usually preferred that the duration of the pulse width added by the pulse-width adding circuit 21 and the duration of the dead time generated by the first and second dead-time generating units 31, 32 be the same, it is nevertheless not necessary for them to be the same. As explained with reference to Embodiment 1, for example, the duration of the pulse width added by the pulse-width adding circuit 21 may be set to be longer than the dead time generated by the first and second dead-time generating units 31, 32.

Other Modified Examples

In Embodiments 1 through 3, an explanation has been made on the case in which the calibration unit 6 that carries out the DC offset correction and the duty correction of the PWM signals of the amplifier 1 is used. However, as the dead time compensation is a characteristic feature of the present embodiment, the calibration unit 6 may be omitted. In this case, it is possible to omit the input switching unit 2, the calibration D/A converter 7, etc.

In Embodiments 2 and 3, an explanation has been made on the case in which the class D amplification operation and the class BD amplification operation can be switched. However, the dead-time compensating circuit 10 may also be set in the amplifier 1 that carries out only the class D amplification operation.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An amplifier comprising:
a PWM (pulse width modulation) converter configured to generate differential PWM signals by comparing differential input signals with a reference signal; and
a power amplifier including a driver circuit having a power supply terminal and a ground terminal, and configured to drive a load with differential driving signals, a controller that is configured to set a dead time in the differential driving signals to prevent current flows between the power supply terminal and the ground terminal, and a compensator that is configured to generate the differential driving signals on the basis of the differential PWM signals and send the differential driving signals to the controller, the differential driving signals including a pulse width for compensating for the dead time to be set in the differential driving signals by the controller.

2. The amplifier according to claim 1, wherein the compensator is configured to add the pulse width for compensating for the dead time to one of the differential PWM signals to produce extended PWM signals.

3. The amplifier according to claim 2, wherein the compensator is also configured to add the pulse width for compensating for the dead time to one of the phase difference signals of the differential PWM signals to produce extended phase difference signals.

4. The amplifier according to claim 3, wherein the compensator comprises a first selecting unit for selecting between a first of the extended PWM signals and a first of the extended phase difference signals, and a second selecting unit for selecting between a second of the extended PWM signals and a second of the extended phase difference signals.

5. The amplifier according to claim 4, wherein the controller comprises a first dead-time generating unit that sets the dead time using the signal selected by the first selecting unit and an inverted signal thereof, and a second dead-time generating unit that sets the dead time using the signal selected by the second selecting unit and an inverted signal thereof.

6. The amplifier according to claim 5, wherein the first and second dead-time generating units each comprise a delay circuit.

7. The amplifier according to claim 2, wherein the controller comprises a first dead-time generating unit that sets the dead time using a first of the extended PWM signals and an inverted signal thereof, and a second dead-time generating unit that sets the dead time using a second of the extended PWM signals and an inverted signal thereof.

8. The amplifier according to claim 7, wherein the first and second dead-time generating units each comprise a delay circuit.

9. The amplifier according to claim 1, wherein the controller and the compensator are configured to adjust a duration of the pulse width for compensating for the dead time and a duration of the dead time according to the load.

10. The amplifier according to claim 1, wherein a duration of the dead time and a duration of the pulse width for compensating for the dead time are equal to each other.

11. The amplifier according to claim 1, wherein a duration of the dead time is shorter than a duration of the pulse width for compensating for the dead time.

12. The amplifier according to claim 1, wherein the reference signal is a sawtooth or triangular reference signal.

13. A power amplifier comprising:
a driver circuit having a power supply terminal and a ground terminal, and configured to drive a load with differential driving signals;
a controller configured to set a dead time in the differential driving signals to prevent current flows between the power supply terminal and the ground terminal; and
a compensator configured to generate the differential driving signals on the basis of differential PWM signals input thereto and send the differential driving signals to the controller, the differential driving signals including a pulse width for compensating for the dead time to be set in the differential driving signals by the controller.

14. The power amplifier according to claim 13, wherein the compensator is configured to add the pulse width for compensating for the dead time to each of the differential PWM signals to produce extended PWM signals.

15. The power amplifier according to claim 14, wherein the controller comprises a first dead-time generating unit that sets the dead time using a first of the extended PWM signals and an inverted signal thereof, and a second dead-time generating unit that sets the dead time using a second of the extended PWM signals and an inverted signal thereof.

16. A method of amplifying differential input signals to produce amplified differential output signals for driving a load, the method comprising the steps of:
generating differential PWM (pulse width modulation) signals by comparing the differential input signals with a reference signal; and
generating differential driving signals on the basis of the differential PWM signals, the differential driving signals including a pulse width for compensating for a dead time to be set in the differential driving signals; and
setting the dead time in the differential driving signals to produce the amplified differential output signals for driving the load.

17. The method of claim 16, further comprising:
adjusting a duration of the pulse width for compensating for the dead time and a duration of the dead time according to the load.

18. The method of claim 17, wherein the duration of the dead time and the duration of the pulse width for compensating for the dead time are equal to each other.

19. The method of claim 17, wherein the duration of the dead time is shorter than the duration of the pulse width for compensating for the dead time.

20. The method of claim 16, further comprising the step of:
inverting the differential driving signals,
wherein the dead time is set using the differential driving signals and the inverted differential driving signals.

* * * * *